United States Patent
Pu et al.

(10) Patent No.: US 8,592,905 B2
(45) Date of Patent: Nov. 26, 2013

(54) HIGH-VOLTAGE SEMICONDUCTOR DEVICE

(75) Inventors: Shih-Chieh Pu, New Taipei (TW);
Ching-Ming Lee, Miaoli County (TW);
Wei-Lun Hsu, Hsin-Chu Hsien (TW);
Chih-Chung Wang, Hsinchu (TW);
Ke-Feng Lin, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 326 days.

(21) Appl. No.: 13/169,008

(22) Filed: Jun. 26, 2011

(65) Prior Publication Data
US 2012/0326266 A1 Dec. 27, 2012

(51) Int. Cl.
*H01L 29/66* (2006.01)

(52) U.S. Cl.
USPC .......................................... 257/343; 257/335

(58) Field of Classification Search
USPC ......... 257/506, 499, 501, 502, 544, 545, 335, 257/336, 337, 339, 341, 343
See application file for complete search history.

(56) References Cited

U.S. PATENT DOCUMENTS

| | | | |
|---|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |

(Continued)

*Primary Examiner* — Julio J Maldonado
*Assistant Examiner* — Robert Bachner
(74) *Attorney, Agent, or Firm* — Winston Hsu; Scott Margo

(57) ABSTRACT

A high-voltage semiconductor device is disclosed. The HV semiconductor device includes: a substrate; a well of first conductive type disposed in the substrate; a first doping region of second conductive type disposed in the p-well; a first isolation structure disposed in the well of first conductive type and surrounding the first doping region of second conductive type; and a first drift ring of second conductive type disposed between the first doping region of second conductive type and the first isolation structure.

20 Claims, 2 Drawing Sheets

(56) References Cited

U.S. PATENT DOCUMENTS

| | | |
|---|---|---|
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0109081 A1 | 5/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0079849 A1 * | 4/2011 | Yan et al. ............. 257/343 |

* cited by examiner

HIGH-VOLTAGE SEMICONDUCTOR DEVICE

BACKGROUND OF THE INVENTION

1. Field of the Invention

The invention relates to a high voltage diode (HV Diode), and more particularly, to a HV diode using conductive drift rings for providing stable breakdown voltage.

2. Description of the Prior Art

Double diffuse drain (DDD) is a diode structure that is applied to HVMOS transistors. The high-voltage diode structure is able to provide the HVMOS transistor with a higher breakdown voltage. This can prevent a high voltage, such as electrostatic discharge (ESD), from damaging the transistor. Furthermore, the hot electron effect resulting from short channel is avoided.

Conventional HV diode typically includes a substrate, a n+ doping region disposed in the substrate and a field oxide layer surrounding the n+ doping region. However, the conventional HV diode framework has some drawbacks. For instance, a breakdown is often found at the junction between the n+ doping region and the field oxide layer after long period of operation to cause a serious shift to the breakdown voltage of the device. Hence, how to provide a stable and reliable structure for resolving this issue has become and important task in this field.

SUMMARY OF THE INVENTION

It is an objective of the present invention to provide a HV diode for resolving the aforementioned issue caused by conventional architecture.

According to a preferred embodiment of the present invention, a high-voltage semiconductor device is disclosed. The HV semiconductor device includes: a substrate; a p-well disposed in the substrate; a first n-type doping region disposed in the p-well; a first isolation structure disposed in the p-well and surrounding the first n-type doping region; and a first n-type drift ring disposed between the first n-type doping region and the first isolation structure.

According to a preferred embodiment of the present invention, a high-voltage semiconductor device is disclosed. The HV semiconductor device includes: a substrate; a well of first conductive type disposed in the substrate; a first doping region of second conductive type disposed in the p-well; a first isolation structure disposed in the well of first conductive type and surrounding the first doping region of second conductive type; and a first drift ring of second conductive type disposed between the first doping region of second conductive type and the first isolation structure.

Another aspect of the present invention disclosed a high-voltage semiconductor device, which includes: a substrate; a well of first conductive type disposed in the substrate; a first doping region of second conductive type disposed in the well of first conductive type; a first isolation structure disposed in the well of first conductive type and surrounding the first doping region of second conductive type; and a first drift ring of second conductive type disposed directly under the first isolation structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
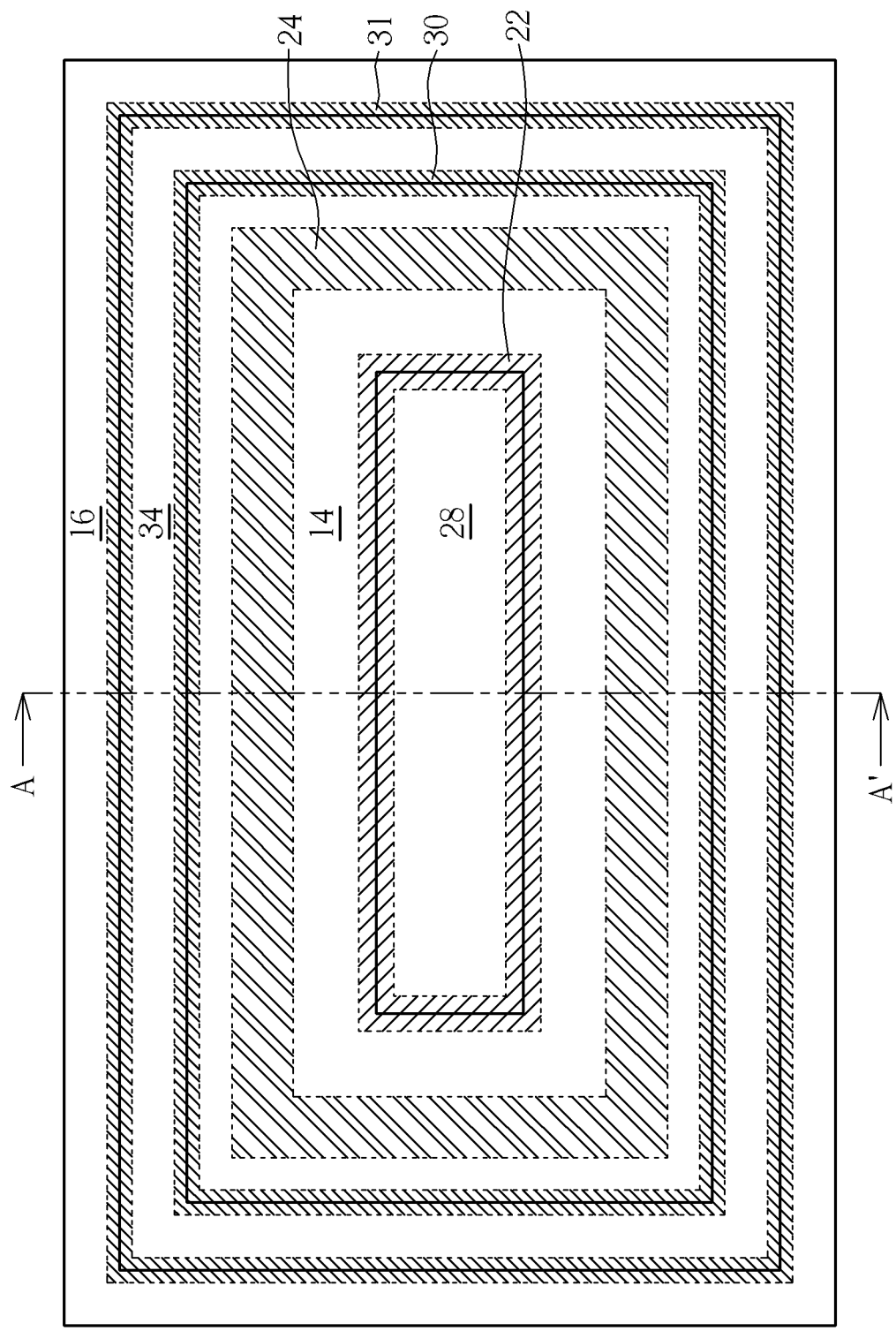
FIG. 1 illustrates a top view of a HV diode according to a preferred embodiment of the present invention.
Figure 2:
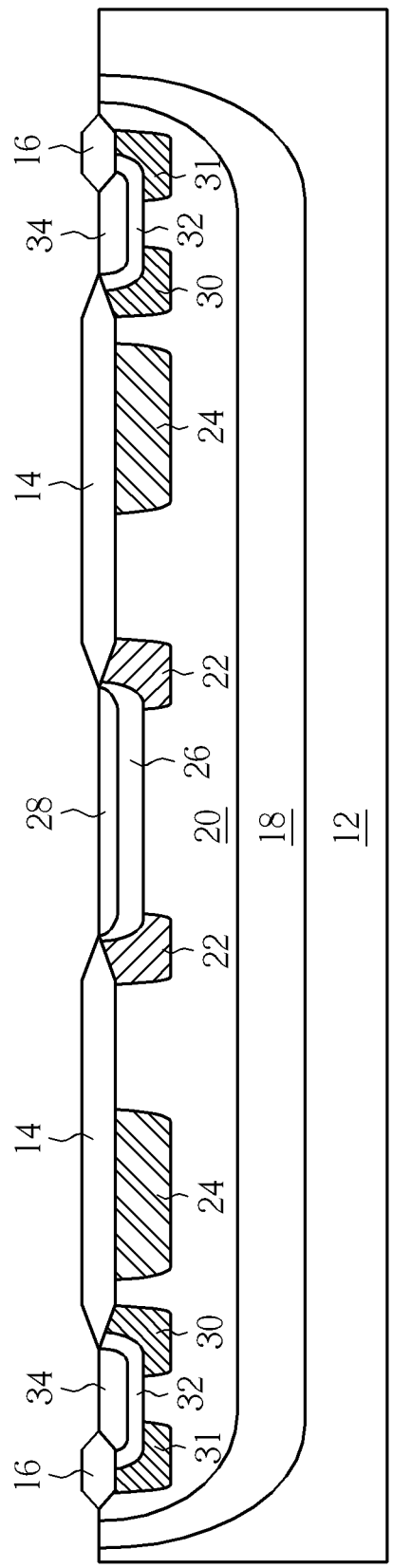
FIG. 2 illustrates a cross-section view of FIG. 1 along the sectional line AA'.

Referring to FIGS. 1-2, FIG. 1 illustrate a top view of a HV diode according to a preferred embodiment of the present invention and FIG. 2 illustrates a cross-section view of FIG. 1 along the sectional line AA'. As shown in the figures, a substrate 12, such as a p-type substrate is provided, in which the substrate 12 could be a silicon substrate or a silicon-on-insulator substrate.

An ion implantation and a thermal oxidation process are then performed to form a plurality of doping regions and isolation structures, such as by first using a thermal oxidation process to form a first field oxide layer 14 and a second field oxide layer 16 shown in the figures, and then performing a n-type ion implantation to form a deep n-well 18 in the substrate 12. A p-type ion implantation is then conducted thereafter to form a p-well 20 in the deep n-well 18. The first field oxide layer 14 and the second field oxide layer 16 are used for increasing breakdown voltage of a single device, hence other structures such as shallow trench isolations (STI) could be used to replace the field oxide layers disclosed in this embodiment, which are also within the scope of the present invention. It should be noted that regions other than field oxides or STIs disclosed in this embodiment are in the active region.

A patterned resist (not shown) is then formed on the substrate 12, and a low concentration n-type ion implantation is performed by using the patterned resist as mask to form at least a n-type drift ring, such as a first n-type drift ring 22 and second n-type drift ring 24 in the p-well 20. In this embodiment, the first n-type drift ring 22 is formed in the interior and surrounding by the second n-type drift ring 24, in which the doping concentration of the first n-type drift ring 22 and the second n-type drift ring 24 is about 1E12.

Next, two n-type ion implantations are conducted sequentially by using two different patterned resist (not shown) to form a first n-grade region 26 in the p-well 20 and a n+ region 28 in the n-grade region 26, in which the doping concentration of the n-grade region 26 is substantially higher than the first n-type drift ring 22 and the second n-type drift ring 24 and the doping concentration of the n+ region 28 is substantially higher than the n-grade region 26. In this embodiment, the doping concentration of the n-grade region 26 is about 1E13 while the doping concentration of the n+ region 28 is about 1E15. Preferably, both the n+ region 28 and the n-grade region 26 are disposed in the substrate 12 of the first field oxide layer 14, such as disposed in the active region surrounded by the first field oxide layer 14.

It should be noted that the first n-type drift ring 22 is preferably disposed between the first field oxide layer 14 and the n+ region 28, and specifically at the junction of the two regions, in which the first n-type drift ring 22, the n-grade region 26 and the n+ region 28 are substantially overlapping each other. The second n-type drift ring 24 on the other hand is disposed in the substrate 12 directly under the first field oxide layer 14 and completely surrounded and isolated by the p-well 20.

A p-type ion implantation is then performed by using another patterned resist (not shown) as mask to form two p-type drift rings 30, 31 between the first field oxide layer 14 and the second field oxide layer 16. Next, two p-type ion implantations are conducted sequentially by using two different patterned resist (not shown) to form a p-grade region 32 in the p-well 20 and a p+ region 34 in the p-grade region 32, in which the doping concentration of the p-grade region 32 is substantially higher than the p-type drift rings 30, 31 and the doping concentration of the p+ region 34 is substantially higher than the p-grade region 32. In this embodiment, the p+ region 34 and p-grade region 32 are disposed between the first field oxide layer 14 and the second field oxide layer 16 and the two p-type drift rings 30, 31 are also disposed in the junction between the p+ region 34 and the first field oxide layer 14 and the second field oxide layer 16, in which the p-grade region 32 and p+ region 34 substantially overlap the two p-type drift rings 30, 31. This completes the fabrication of a HV diode according to a preferred embodiment of the present invention. It should be noted that the process for forming the doping regions is not limited to the order disclosed in the aforementioned embodiment, and the conductive types (such as n-type and p-type) of the regions could also be switched according to the demand of the product, which is also within the scope of the present invention.

As conventional HV diode typically induces a breakdown at the junction between the n+ region and the field oxide layer so that a shift in breakdown voltage is resulted after long period of operation, the present invention preferably forms a n-type drift ring at the junction between the n+ region and the field oxide layer while not adding any extra mask during the fabrication process. By using the n-type drift ring to enforce the junction between these two regions, currents are induced into the substrate instead of concentrating on the surface between the n+ region and the field oxide layer so that damage to the substrate surface if prevented.

In addition to forming the n-type drift ring between the n+ region and the field oxide layer, the n-type drift ring could also be formed directly under the field oxide layer as disclosed by another embodiment of the present invention. Alternatively, the present invention could first form a n-type drift ring between the n+ region and the field oxide layer, and then form another n-type drift ring directly under the field oxide layer to improve the stability of the HV diode structure, which is also within the scope of the present invention.

Those skilled in the art will readily observe that numerous modifications and alterations of the device and method may be made while retaining the teachings of the invention.

What is claimed is:

1. A high-voltage semiconductor device, comprising:
a substrate;
a well of first conductive type disposed in the substrate;
a first doping region of second conductive type disposed in the well of first conductive type;
a first isolation structure disposed in the well of first conductive type and surrounding the first doping region of second conductive type; and
a first drift ring of second conductive type disposed between the first doping region of second conductive type and the first isolation structure.

2. The high-voltage semiconductor device of claim 1, wherein the first isolation structure comprises a field oxide layer.

3. The high-voltage semiconductor device of claim 1, further comprising a second doping region of second conductive type directly under the first doping region of second conductive type.

4. The high-voltage semiconductor device of claim 1, further comprising a second isolation structure surrounding the first isolation structure.

5. The high-voltage semiconductor device of claim 4, further comprising a first doping region of first conductive type disposed between the first isolation structure and the second isolation structure.

6. The high-voltage semiconductor device of claim 5, further comprising a second doping region of first conductive type directly under the first doping region of first conductive type.

7. The high-voltage semiconductor device of claim 5, further comprising a first drift ring of first conductive type disposed between the first doping region of first conductive type and the first isolation structure.

8. The high-voltage semiconductor device of claim 5, further comprising a second drift ring of first conductive type disposed between the first doping region of first conductive type and the second isolation structure.

9. The high-voltage semiconductor device of claim 1, further comprising a second drift ring of second conductive type directly under the first isolation structure.

10. The high-voltage semiconductor device of claim 1, wherein the first conductive type comprises p-type and the second conductive type comprises n-type.

11. A high-voltage semiconductor device, comprising:
a substrate;
a well of first conductive type disposed in the substrate;
a first doping region of second conductive type disposed in the well of first conductive type;
a first isolation structure disposed in the well of first conductive type and surrounding the first doping region of second conductive type; and
a first drift ring of second conductive type disposed directly under the first isolation structure.

12. The high-voltage semiconductor device of claim 11, wherein the first isolation structure comprises a field oxide layer.

13. The high-voltage semiconductor device of claim 11, further comprising a second doping region of second conductive type directly under the first doping region of second conductive type.

14. The high-voltage semiconductor device of claim 11, further comprising a second isolation structure surrounding the first isolation structure.

15. The high-voltage semiconductor device of claim 14, further comprising a first doping region of first conductive type disposed between the first isolation structure and the second isolation structure.

16. The high-voltage semiconductor device of claim 15, further comprising a second doping region of first conductive type directly under the first doping region of first conductive type.

17. The high-voltage semiconductor device of claim 15, further comprising a first drift ring of first conductive type disposed between the first doping region of first conductive type and the first isolation structure.

18. The high-voltage semiconductor device of claim 15, further comprising a second drift ring of first conductive type disposed between the first doping region of first conductive type and the second isolation structure.

19. The high-voltage semiconductor device of claim 11, further comprising a second drift ring of second conductive type disposed between the first doping region of second conductive type and the first isolation structure.

20. The high-voltage semiconductor device of claim 11, wherein the first conductive type comprises p-type and the second conductive type comprises n-type.

* * * * *